(12) United States Patent
Miller

(10) Patent No.: US 9,170,974 B2
(45) Date of Patent: Oct. 27, 2015

(54) METHODS AND SYSTEMS FOR INTERCONNECTING HOST AND EXPANSION DEVICES WITHIN SYSTEM-IN-PACKAGE (SIP) SOLUTIONS

(71) Applicant: Gary L. Miller, Austin, TX (US)

(72) Inventor: Gary L. Miller, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 364 days.

(21) Appl. No.: 13/775,330

(22) Filed: Feb. 25, 2013

(65) Prior Publication Data

US 2014/0244873 A1      Aug. 28, 2014

(51) Int. Cl.
| | |
|---|---|
| G06F 13/40 | (2006.01) |
| G06F 13/364 | (2006.01) |
| H01L 21/762 | (2006.01) |
| H01L 21/50 | (2006.01) |

(52) U.S. Cl.
CPC ............ *G06F 13/409* (2013.01); *G06F 13/364* (2013.01); *H01L 21/50* (2013.01); *H01L 21/76251* (2013.01)

(58) Field of Classification Search
CPC .. H01L 21/50; H01L 21/76251; G06F 13/409
USPC ................. 710/8–10, 104, 300–302
See application file for complete search history.

(56) References Cited

U.S. PATENT DOCUMENTS

| | | | |
|---|---|---|---|
| 6,480,131 | B1 | 11/2002 | Roper et al. |
| 6,845,027 | B2 | 1/2005 | Mayer et al. |
| 6,970,966 | B2 | 11/2005 | Gemelli et al. |
| 7,827,336 | B2 | 11/2010 | Miller et al. |
| 2009/0310521 | A1 | 12/2009 | Kanerva et al. |
| 2011/0135046 | A1 | 6/2011 | Jones et al. |
| 2014/0134803 | A1* | 5/2014 | Kelly et al. .................... 438/118 |

FOREIGN PATENT DOCUMENTS

WO     WO2008/042595 A2     4/2008

OTHER PUBLICATIONS

Sharma et al., "Die-To-Die Bonding Using Copper Pillars", Freescale Semiconductors, May 30, 2012, 4 pgs.
Miller, "Methods and Systems for Address Mapping Between Host and Expansion Devices Within System-In-Package (SiP) Solutions", U.S. Appl. No. 13/775,313, filed Feb. 25, 2013, 33 pgs.
Office Action mailed Apr. 24, 2015, "Methods and Systems for Address Mapping Between Host and Expansion Devices Within System-In-Package (SiP) Solutions", U.S. Appl. No. 13/775,313, filed Feb. 25, 2013, 6 pgs.
Response filed Jul. 24, 2015, "Methods and Systems for Address Mapping Between Host and Expansion Devices Within System-In-Package (SiP) Solutions", U.S. Appl. No. 13/775,313, filed Feb. 25, 2013, 7 pgs.

* cited by examiner

*Primary Examiner* — Glenn A Auve
(74) *Attorney, Agent, or Firm* — Egan, Peterman & Enders LLP.

(57) ABSTRACT

Methods and systems are disclosed for interconnecting die-to-die-port (DTDP) host devices and DTDP expansion devices for combined system-in-package (SiP) solutions. Interconnect circuitry having a plurality of ports is configured to provide communication from the host device to the expansion device so that the expansion device appears to be resident on the host device. Further, direct circuit interconnection blocks (e.g., using copper pillar (CuP) connectors) can be used to improve connectivity and performance. In addition, level shift circuitry can be utilized within expansion devices to allow for standardized interconnect signals and supply voltages to be provided by DTDP host devices to DTDP expansion devices.

20 Claims, 10 Drawing Sheets

METHODS AND SYSTEMS FOR INTERCONNECTING HOST AND EXPANSION DEVICES WITHIN SYSTEM-IN-PACKAGE (SIP) SOLUTIONS

TECHNICAL FIELD

This technical field relates to system-in-package (SiP) technology and, more particular, to the connection of integrated circuits within SiP devices.

BACKGROUND

System-in-package (SiP) technology currently attempts to combine numerous different types of semiconductor devices within a single semiconductor package. Within these SiP packages, connections between semiconductor devices are often implemented using wire bonding to bond pads located in the periphery of the semiconductor devices. Flip-chip techniques having solder bumps have also been utilized; however, the solder bump grid for a particular semiconductor device is still connected to bond pad sites at the periphery of the semiconductor device. Further, SiP implementations are typically implemented as specific solutions for the particular semiconductor devices included within the SiP device.

FIG. 1 (Prior Art) is a block diagram of an embodiment 100 for an integrated circuit (IC) layout used for connecting a prior host processor device 102 to a prior secondary device 120. The integrated circuit represented for the host processor device 102 includes a plurality of different circuit block areas, which are represented by blocks 104, 106, 108, and 110. Further, regions 112 between these circuit blocks are typically used for additional drivers, logic circuitry, and/or routing circuitry related to the circuit blocks. In addition, peripheral regions are located at the edges of the integrated circuit for the host processor device 102. These peripheral regions are represented by the arrows between the edge of the integrated circuit and the circuit blocks 104, 106, 108, and 110. Typically, these peripheral regions or periphery for the host processor device 102 is used in part for bond pads that are in turn utilized for external connections. As depicted, four bond pads 118 within the periphery are shown that are used for making external connections to the secondary device 120.

The integrated circuit represented for the secondary device 120 also includes a plurality of different circuit block areas, which are represented by blocks 122 and 124. Further, region 126 is also located between these circuit blocks and can be used for additional drivers, logic circuitry, and/or routing circuitry related to the circuit blocks. The periphery for the integrated circuit for the secondary device 120, which is represented by the arrows between the edge of the integrated circuit and the circuit blocks 122 and 124, include four bond pads 128 that are used for making external connections to the host processor device 102. Once connected, the two devices 102 and 120 can be packaged together to form a single SiP device. While the bond pad connections provide connectivity, they also require driver circuitry to drive the external interfaces for the bond pad connections, and connection speeds are limited by the nature of the external connections.

Copper pillar (CuP) interconnect technology has been used in the past for dedicated connections to a particular secondary IC. This CuP interconnect technology relies upon copper pillar structures built on top of integrated circuits to provide CuP connections. The CuP connections allow for direct circuit connections to underlying circuitry. A prior memory solution has utilized CuP connections to stack multiple memory integrated circuits (ICs) on top of each other in a single memory SiP device. As such, the CuP connections were configured specifically to work with memory ICs. Another prior product development aid has used CuP connections to connect a microcontroller to a buddy development IC, which was used to collect operational data for the microcontroller during prototype development and was then removed. As such, the CuP connections were configured specifically to work with the buddy development IC and were effectively removed from use after production launch of the microcontroller when the buddy IC was no longer included in packaging.

Prior host processor IC devices have also used interconnect fabric circuitry for internal communications. FIG. 4 (Prior Art) is a block diagram of an embodiment 400 for a prior interconnect fabric (ICF) 405. As depicted, the ICF 405 includes input stages, decode blocks, and multiplexers. For the embodiment 400 depicted, input stage 420 is connected to a CPU (central processing unit) master block 404, a decode block 426, and multiplexers (MUXs) 432 and 434. Input stage 422 is connected to a DMA (direct memory access) master block 406, a decode block 428, and multiplexers (MUXs) 432 and 434. MUX 432 is also connected to a first slave block (SLAVE 1) 408, and MUX 434 is also connected to a second slave block (SLAVE 2) 410. During operation, communications from the master blocks 404 and 406 are routed to slave blocks 408 and 410 by decoding the destination device addresses within communication packages using decode blocks 426 and 428. Example slave blocks include memory and peripheral blocks that are integrated within the same integrated circuit as the master blocks 404 and 406 and the interconnect fabric (ICF) 405.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale FIG. 1 (Prior Art) is a block diagram of an embodiment for an integrated circuit (IC) layout used for connecting a prior host processor device to a prior secondary device.

DETAILED DESCRIPTION

Figure 1:
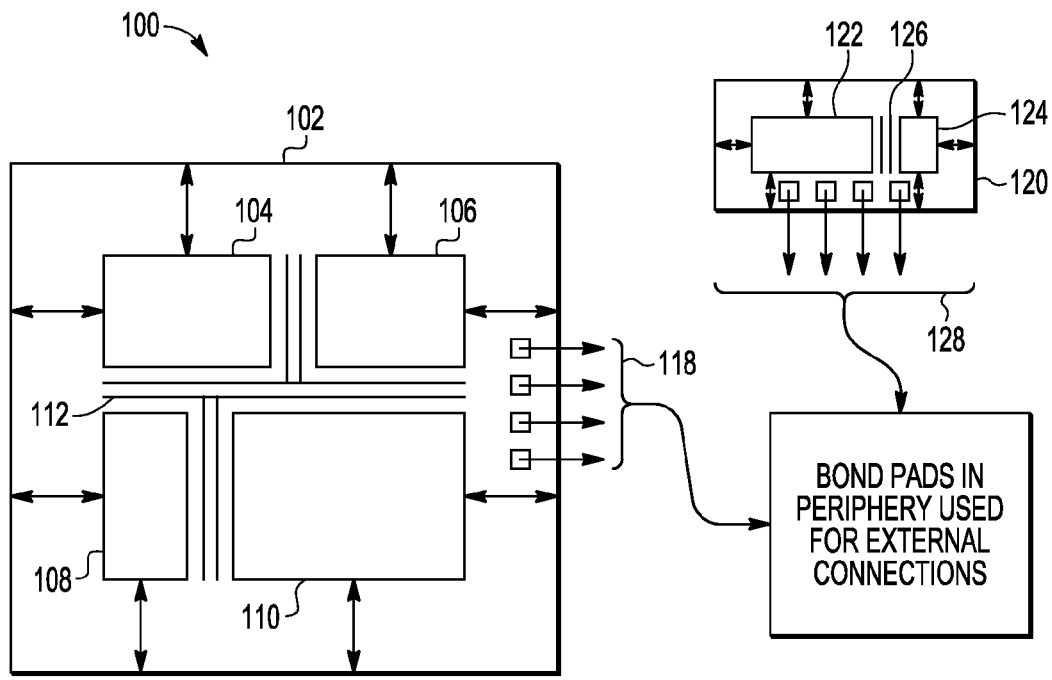

Methods and systems are disclosed for interconnecting die-to-die-port (DTDP) host devices and DTDP expansion devices for combined system-in-package (SiP) solutions. Interconnect circuitry having a plurality of ports is configured to provide communication from the host device to the expansion device so that the expansion device appears to be resident on the host device. Further, direct circuit interconnection blocks (e.g., using copper pillar (CuP) connectors) can be used to improve connectivity and performance. In addition, level shift circuitry can be utilized within expansion devices and/or within the host devices to allow for standardized interconnect signals and supply voltages to be provided by DTDP host devices to DTDP expansion devices. Still further, configurable address mapping can be used to re-configure the host memory map to include expansion memory map details in a seamless fashion. Different features and variations can also be implemented, as desired, and related or modified systems and methods can be utilized, as well.

The die-to-die port (DTDP) technology described herein, allows for a variety of advantageous features, including an integrated memory map, an expansion device that appears to be resident on a host device or system-on-a-chip (SoC), technology independent device combinations, more rapid introduction of expanded memory and/or peripheral functions, more rapid creation of new microcontroller products, the use of standard internal microcontroller bus architectures, extremely low latency connections, and plug-and-play capabilities for expansion memory and other processing devices. The disclosed embodiments provide an effective and efficient interconnect method between semiconductor devices in system-in-package (SiP) solutions, where it is desirable to combine numerous different types of semiconductor devices in one package. Further, the disclosed embodiments provide an architecture that allows for the effective use of various internal and external circuit designs in SiP configurations. Still further, by allowing for greater ease in combining semiconductor devices within a SiP configuration, the disclosed embodiments effectively reduce production cycle times.

As described in more detail below, the DTDP systems and related methods described herein allow for an expansion device to be attached to an internal bus fabric for a microcontroller or other host device and thereby allow for a wide variety of SiP configurations that add memory array expansion devices (e.g., FLASH memory devices, other memory devices), peripheral expansion devices (e.g., USB connection, receiver, transmitter, transceiver, radio, other peripheral devices), or other desired expansion devices to microcontrollers or other DTDP host devices. As further described below, a microcontroller or processing device that implements the disclosed embodiments can utilize master port logic for a interconnection fabric (ICF), such as crossbar (XBar) master port logic for an AHB (Amba High-speed Bus), to provide an expansion port that is connected to an expansion device. The master port logic, for example, can include configurable address mapping logic for plug-and-play insertion of expansion devices. Default address configuration information can also be provided by the expansion device to the host processing device. Further, existing configuration information within the processing device can be overridden by firmware or non-volatile memory, as needed, to store the address configuration information for the expansion device (e.g., firmware or non-volatile memory may modify a starting address for address maps within the microcontroller or processing device). Further, the embodiments described herein can route standard connector signals to designated connector array locations. In addition, as further described below, the microcontroller or other processing device can provide external voltage supply signals for expansion devices, as well as provide additional bonding sites for future I/O expansion, if desired. Level shift circuitry can also be utilized in expansion devices to allow for standardized signal levels provided by DTDP host devices. Still further, because direct connections can be provided through the copper pillar (CuP) connections or other desired direct circuit connectors, low latency access to the expansion devices can be provided, for example, using standard EDA (electronic design automation) technology (e.g., requiring two or fewer additional clock cycles). Advantageously, the embodiments described herein provide an efficient and effective system architecture and circuitry which can allow microcontrollers and other processing devices to be used in anticipated and unanticipated SiP configurations desired by customers through the combination of DTDP host devices with a library of developed and future developed DTDP expansion devices.

Figure 2:
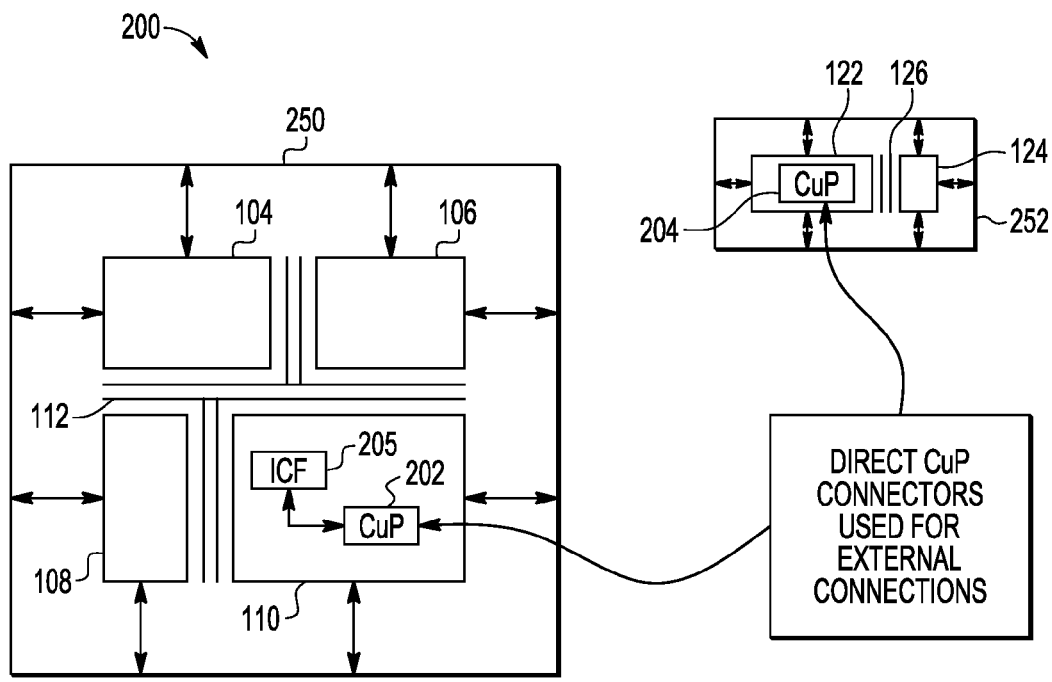
FIG. 2 is a block diagram of an example die-to-die port (DTDP) embodiment that utilizes direct circuit connectors (e.g., copper pillar connectors) and interconnect fabric circuitry to connect a host processor device to an expansion device.

FIG. 2 is a block diagram of an example DTDP embodiment 200 that utilizes CuP connectors 202 and interconnection fabric (ICF) circuitry 205, such as an XBar, to connect a host processor device 250 to an expansion device 252. As with the host processor device 102 in FIG. 1 (Prior Art), the integrated circuit represented for the host processor device 252 includes a plurality of different circuit block areas, which are represented by blocks 104, 106, 108, and 110. Further, regions 112 between these circuit blocks can be used for additional drivers, logic circuitry, and/or routing circuitry related to the circuit blocks. The periphery for the integrated circuit for the host processor device 250 is represented by the arrows between the edge of the integrated circuit and the circuit blocks 104, 106, 108, and 110. Similarly, as with the secondary device 120 in FIG. 1 (Prior Art), the integrated circuit represented for the expansion device 252 includes a plurality of different circuit block areas, which are represented by blocks 122 and 124. Further, region 126 is also located between these circuit blocks and can be used for additional drivers, logic circuitry, and/or routing circuitry related to the circuit blocks. The periphery for the integrated circuit for the expansion device 252 is represented by the arrows between the edge of the integrated circuit and the circuit blocks 122 and 124.

In contrast with embodiment 100 of FIG. 1 (Prior Art), however, embodiment 200 utilizes CuP connectors 202 to directly connect the host processor device 250 to the CuP connectors 204 for the expansion device 252. Further, as described in more detail herein, the ICF circuitry 205 is utilized to provide communications between the host processor device 250 and the expansion device 252 during operation and is further utilized to configure the host processor device 250 at start-up or reset to operate with expansion device 252. Advantageously, the DTDP embodiments described herein allow for a wide variety of expansion devices 252, as well as future developed expansion devices 252, to be combined with the host processor 250 within a single SiP device. It is further noted that while CuP connectors 202 and 204 are depicted, other circuit connector technology could also be utilized instead of or in addition to the CuP connectors described herein.

Figure 3:
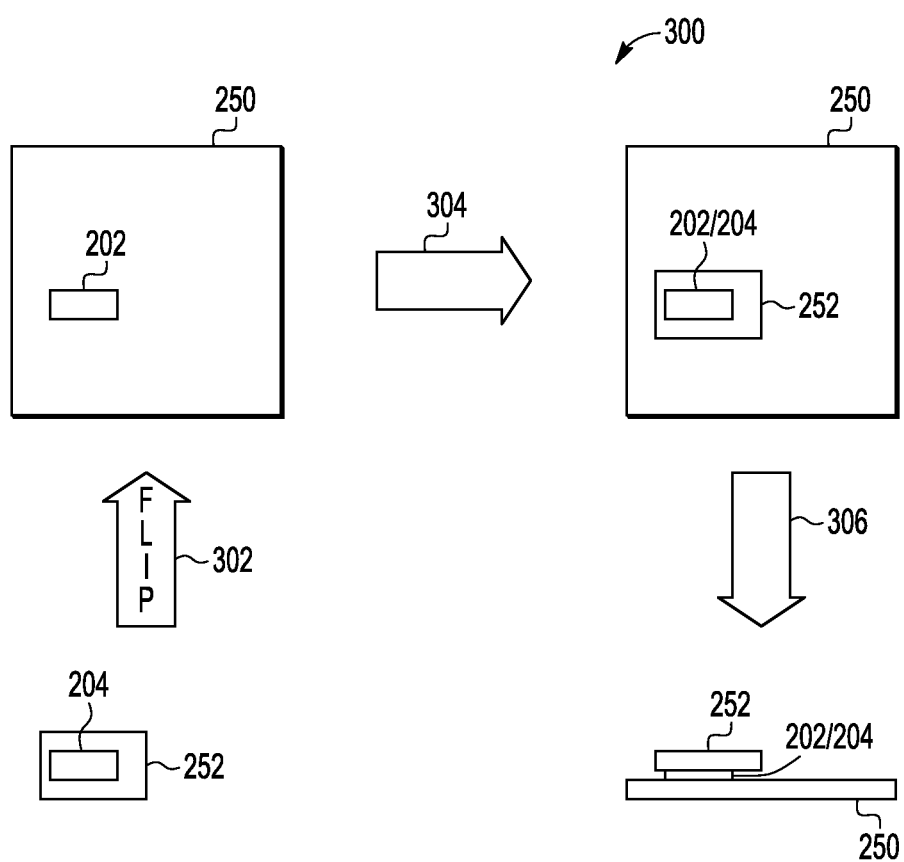
FIG. 3 is a diagram of an embodiment for a DTDP device formed by connecting the host processor device to the expansion device using direct circuit connectors.

FIG. 3 is a diagram of an embodiment 300 for a DTDP device formed by connecting the host processor device 250 to the expansion device 252 using direct circuit connectors. As depicted, a expansion device 252 having direct circuit connectors 204 is flipped on top of the host processor device 250, as represented by arrow (FLIP) 302. The direct circuit connectors 204 are positioned to align with the direct circuit connectors 202 on the processor device 250 in order to form a combined device, as shown by arrow 304. As shown by arrow 306, the resulting combined device includes the expansion device 252 stacked on top of the host processor device 250 and connected to the host processor device 250 through CuP connectors 202/204. Advantageously, a wide variety of expansion devices 252 can be utilized, as described herein.

Figure 5:
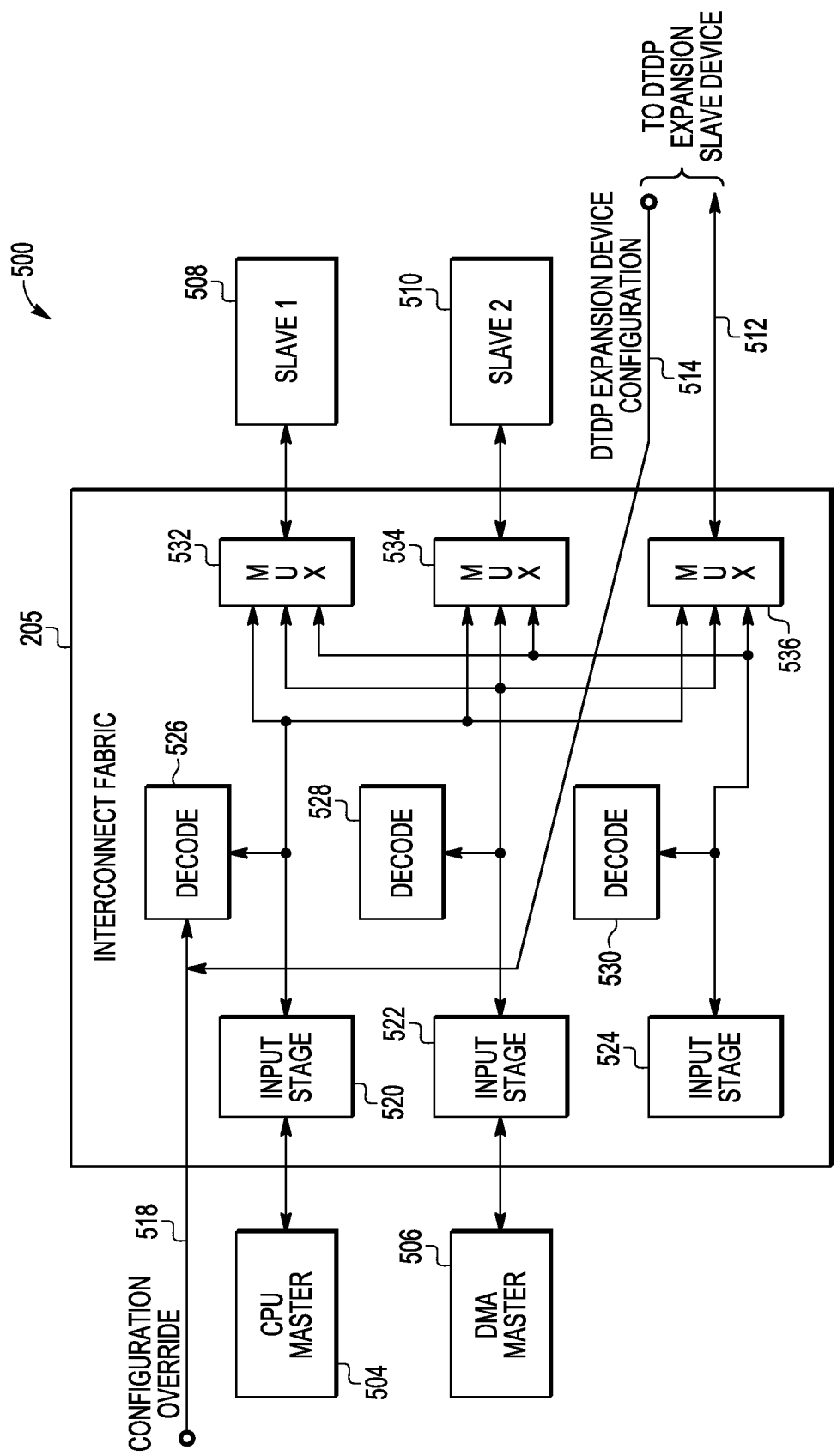
FIG. 5 is a block diagram of an embodiment for an interconnect fabric circuitry that can be used on a DTDP host device to communicate with a DTDP slave expansion device.
Figure 6:
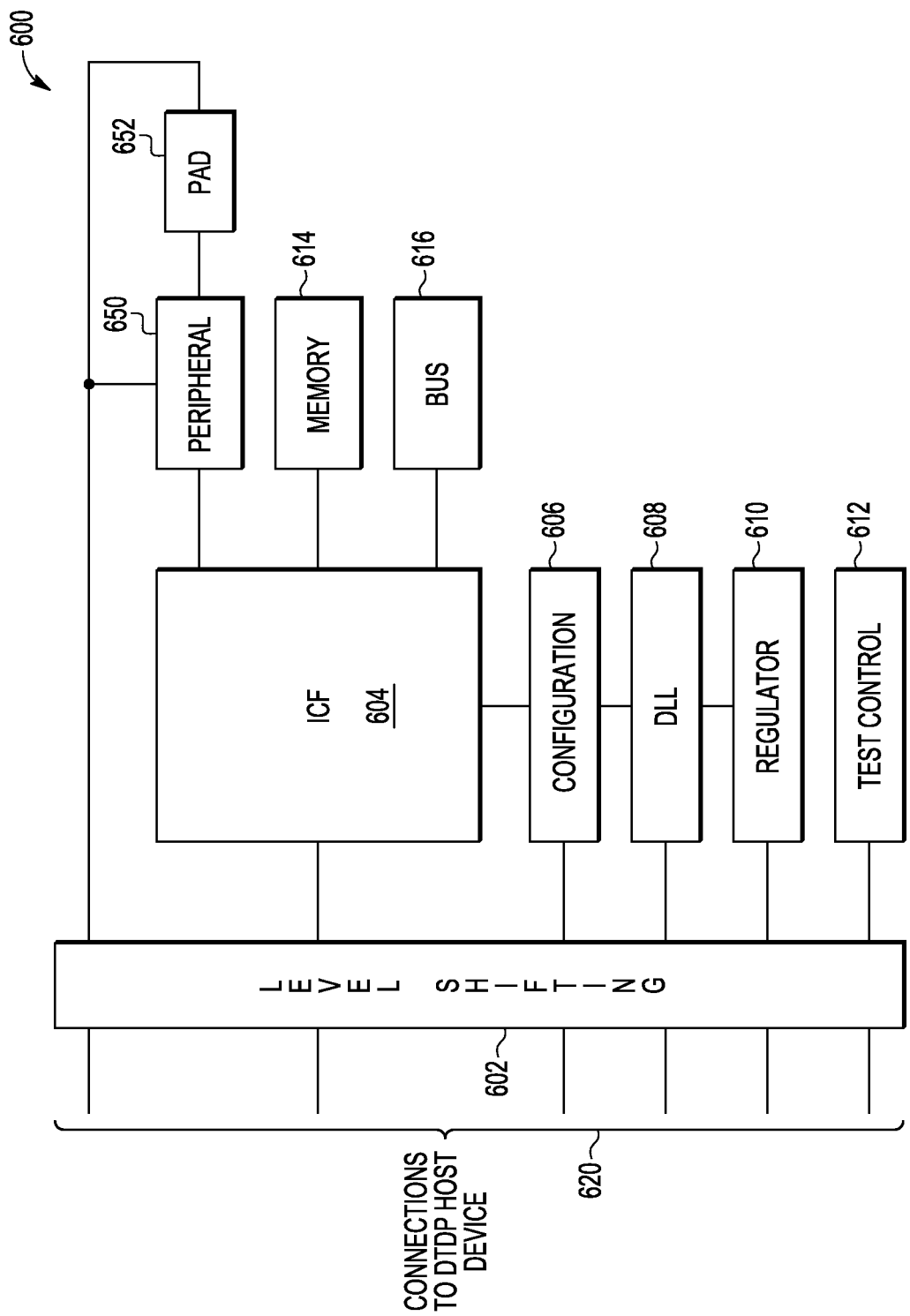
FIG. 6 is a block diagram of an embodiment for a slave DTDP device
Figure 7:
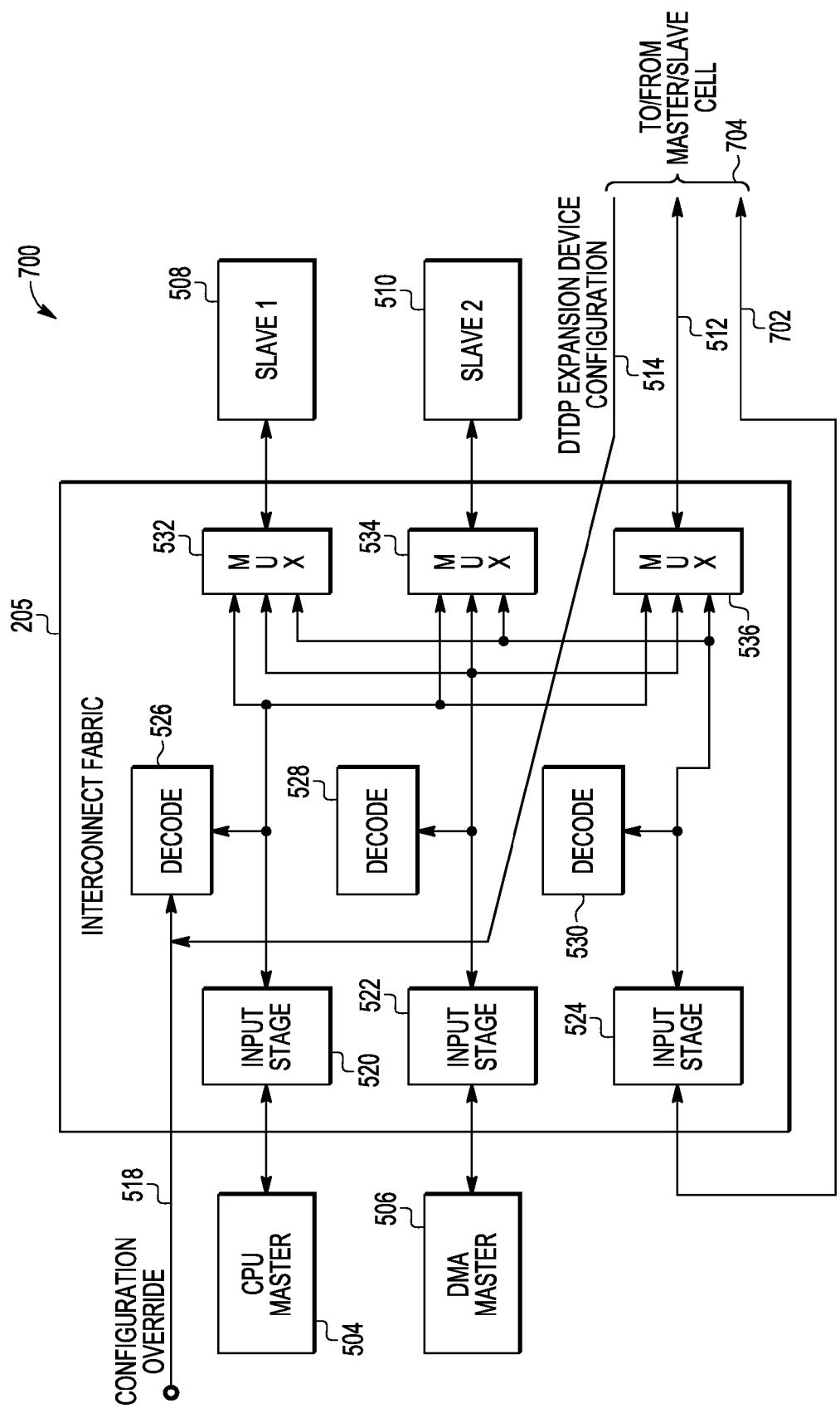
FIG. 7 is a block diagram of an embodiment for an interconnect fabric circuitry that can be used on a DTDP host device to communicate with a DTDP master/slave expansion device.
Figure 8:
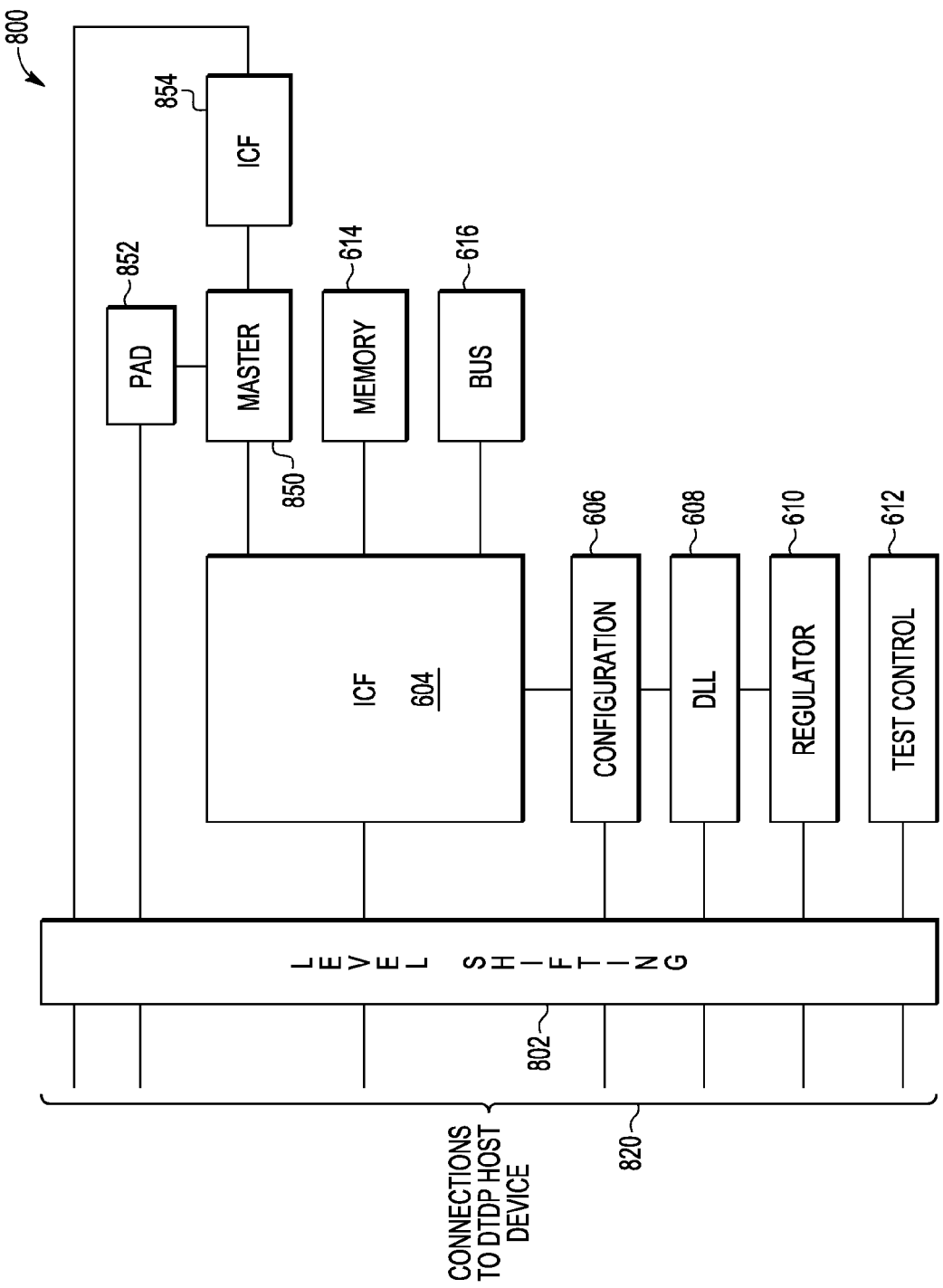
FIG. 8 is a block diagram of an embodiment for a master/slave DTDP device.

The DTDP device embodiments described herein can be implemented using an expansion device 252 that is a slave device or a master/slave device. As a slave device, the expansion device 252 is configured to communicate with a interconnect fabric (ICF) 205 without being a master of the bus connection. As a master/slave device, the expansion device 252 is configured to communicate with the ICF 205 as a slave device or as a master device where the expansion device 252 is the master of the bus connection. FIGS. 5-6 describe embodiments for slave configurations for the ICF 205 for DTDP devices, as described herein. FIGS. 7-8 describe embodiments for master/slave configurations for the ICF 205 for DTDP devices, as described herein.

Figure 4:
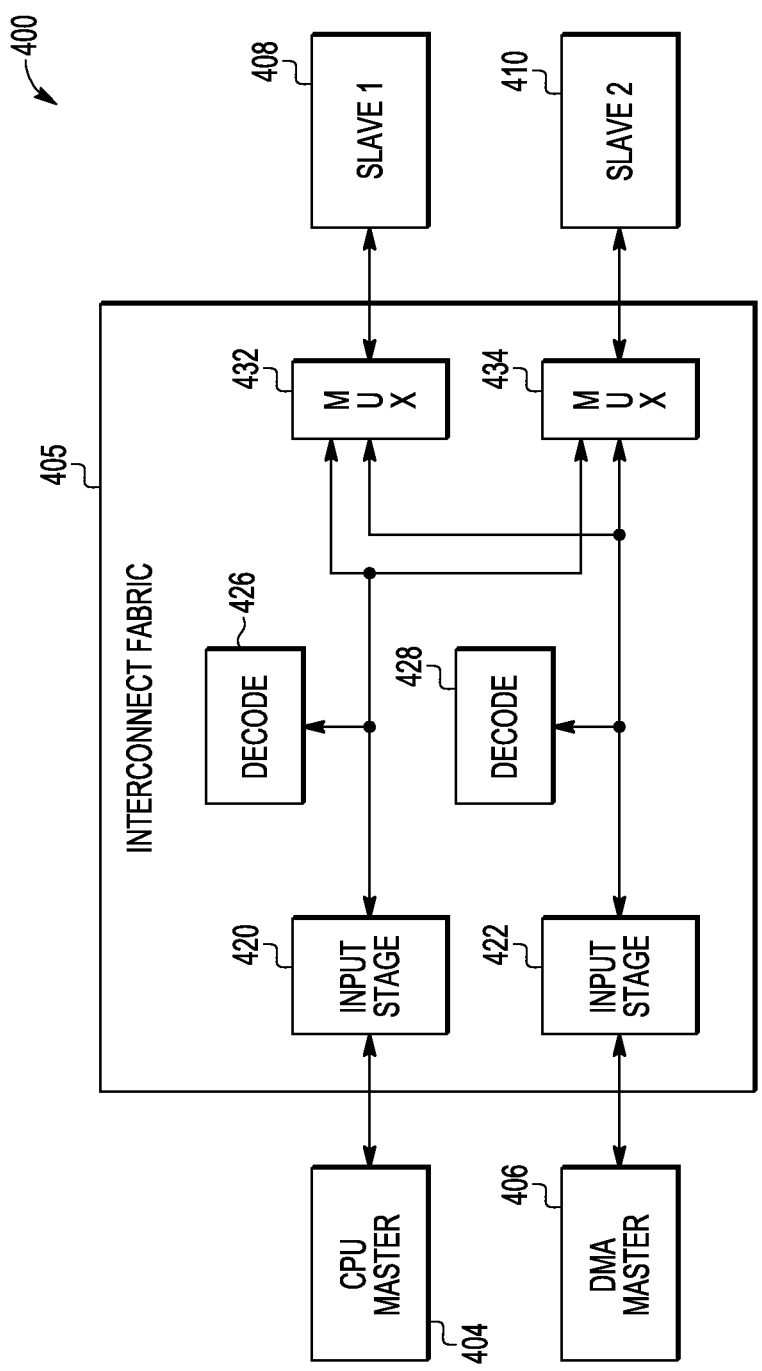
FIG. 4 (Prior Art) is an block diagram of an embodiment for a prior interconnect fabric for an system-on-chip (SoC) device.

FIG. 5 is a block diagram of an embodiment 500 for an interconnect fabric (ICF) 205 that can be used on a DTDP host device to communicate with a DTDP slave expansion device, as described herein. As depicted, the ICF 205 includes three input stages, decode blocks, and multiplexers; however, different and/or additional blocks could also be included, as desired. For the embodiment 500 depicted, input stage 520 is connected to a CPU (central processing unit) master block 504, a decode block 526, and multiplexers (MUXs) 532, 534, and 536. Input stage 522 is connected to a DMA (direct memory access) master block 506, a decode block 528, and multiplexers (MUXs) 532, 534, and 536. Input stage 524 is not connected to a master device but is connected to a decode block 530 and multiplexers (MUXs) 532, 534, and 536. MUX 532 is also connected to a first slave block (SLAVE 1) 508, and MUX 534 is also connected to a second slave block (SLAVE 2) 510. During operation, communications from the master blocks 504 and 506 are routed to slave blocks 508 and 510 by decoding the destination device addresses within communication packages using decode blocks 526 and 528. Example slave blocks include memory and peripheral blocks. However, embodiment 500 and ICF 205 differs from embodiment 400 and ICF 405 used in FIG. 4 (Prior Art) because the ICF 205 is re-configured to allow for seamless communication with a DTDP expansion device that is not included within the same IC device as is assumed to be the case for the embodiment represented in FIG. 4 (Prior Art). It is noted that the port interconnect fabric (ICF) 205 can be any desired interconnect circuitry that provides communication between the various circuit and functional blocks to which it is coupled. For example, high speed serial interconnects and/or other other types of interconnects could be utilized, if desired.

Advantageously, the DTDP host devices described herein re-configure the ICF 205 so that it will provide interconnect communications between the host device and an external DTDP expansion device, such as a slave DTDP expansion device. For the embodiment depicted, the DTDP expansion device is connected to MUX 536, for example, using connections 512. Further, so that decode block 526 can be re-configured to recognize communications from the CPU master block 504 directed to the DTDP expansion device, a configuration override control signal 518 is provided to decode block 526. In addition, DTDP expansion device configuration information is provided from the DTDP slave expansion device through connections 514. The DTDP expansion device configuration information is used to re-configure the decode block 526 so that it will recognize communications directed to the DTDP expansion device and route them to MUX 536. It is further noted that connections 512 and 514 can be provided, for example, using copper pillars (CuP) and related micro-pads, as described herein.

By re-configuring the decode block 526 using the DTDP expansion device configuration information, the DTDP expansion slave device appears to be resident on the host device as another internal operational sub-block for the DTDP host device. As such, the DTDP host device and DTDP expansion device operate as a homogeneous device by default. Further, by using CuP connections, communication delays between the DTDP host device and the DTDP expansion device are reduced. It is further noted that decode block 528 or other additional decode blocks could also be re-configured using the DTDP expansion slave device configuration information, if communication between other master blocks (e.g., DMA master block 506) and the DTDP expansion slave device were desired. Other variations could also be implemented, if desired.

It is noted that plug-and-play (PnP) functionality between different devices have been provided previously with respect to prior standards, such as the USB (universal serial bus) standard, the PCI (peripheral component interconnect) standard, and the LLI (low latency interface) standard. For example, the USB standard has extensive PnP support, from start-up (e.g., Chirp) to the execution of the default endpoint "0" pipe operations, and utilizes USB system drivers and installation of application specific client drivers for USB operations. Using the USB infra-structure, PnP operation is enabled for many different applications/devices from many different vendors. As a further example, the LLI standard from the MIPI Alliance provides a MIPI physical layer (MPHY) interface standard for DRAM access. This MPHY interface is a high speed serial interface with a protocol and link layer defined as part of LLI standard. LLI implementations, which are specifically used for independent DRAM devices, interface with an internal bus fabric and have basic address translation capabilities programmed as part of customer initialization. These prior PnP capabilities, however, establish PnP operation between different devices that operate as independent devices.

In contrast with these prior standards that are configured to establish PnP operation among independent devices, the DTDP embodiments described herein are configured to establish PnP operation between two devices such that they perform as one homogeneous device by default (e.g. out of start-up or reset), with the DTDP expansion device appearing to be resident on the DTDP host device as another internal operational sub-block for the DTDP host device. Additionally, the DTDP embodiments described herein are configured to provide hardware PnP operation for a library of potential DTDP expansion devices that can be configured in a SiP with a DTDP host device without the need for software drivers and/or software configuration (although software override of initial setup settings can be applied within the DTDP embodiments, if desired). As such, unlike prior PnP solutions, no software drivers and/or software setup is required to implement the DTDP embodiments described herein. In addition, the disclosed DTDP embodiments can be implemented to achieve very low and/or optimal latency for accessing macrocell resources in DTDP expansion devices. Further, utilizing the DTDP embodiments described herein, transactions originating on the system bus for the DTDP host device can be configured to be automatically transported between the host and expansions DTDP devices. The software and/or functionality running on the DTDP host device, therefore, needs no indication that there are actually two separate devices working in concert to form a homogeneous device. Still further, using the DTDP embodiments described herein, software functionality can developed identically regardless of the ultimate end use of the software within a single device or combined SiP device. Advantageously, this device-independent environment for software development and support allows for reduced complexity in software development and thereby provides significant reductions in product development, as software development costs typically greatly exceed hardware development costs.

FIG. 6 is a block diagram of an embodiment 600 for a slave DTDP device. Connections 620 are provided as connections to the DTDP host device. Level shifting circuitry 602, which is described in more detail below, can also be provided, if desired. Embodiment 600 also includes an interconnection fabric (ICF) 604, configuration block 606, delayed lock loop (DLL) circuitry 608, regulator 610, and test control circuitry 612. The ICF 604, such as an XBar, can also be connected to additional bus interconnect circuitry (BUS) 616. In addition, the DTDP expansion device functionality, such as a memory block 614 and/or a peripheral block 650, can also be connected to the ICF 604. A pad 652 is also shown as connected to peripheral 650 and the level shifting circuitry 602.

FIG. 7 is a block diagram of an embodiment 700 for an interconnect fabric (ICF) 205 that can be used on a DTDP host device to communicate with a DTDP master/slave expansion device, as described herein. As with FIG. 5, the ICF 205 includes three input stages (520, 522, 524), decode blocks (526, 528, 530), and multiplexers (532, 534, 536). It is again noted that different and/or additional blocks could also be included, as desired. Further, it is again noted that the port interconnect fabric (ICF) 205 can be any desired interconnect circuitry that provides communication between the various circuit and functional blocks to which it is coupled. For example, high speed serial interconnects and/other other types of interconnects could be utilized, if desired.

As indicated above, the DTDP host devices described herein re-configures the ICF 205 so that it will provide interconnect communications between the host device and external DTDP expansion devices, such as a master/slave DTDP expansion device. For the embodiment depicted, the DTDP expansion device is connected to MUX 536, for example, using connections 512. In addition, because the DTDP expansion device for embodiment 700 is a master/slave DTDP expansion device, the DTDP expansion device is also connected to input stage 524 through connections 702. As with FIG. 5, a configuration override control signal 518 is provided to decode block 526 so that decode block 526 can be re-configured to recognize communications from the CPU master block 504 directed to the DTDP expansion device. DTDP expansion device configuration information is provided from the DTDP master/slave expansion device through connections 514. The DTDP expansion device configuration information is used to re-configure the decode block 526 so that it will recognize communications directed to the DTDP expansion device and route them to MUX 536. When operating as a master device, the DTDP expansion device uses input stage 524 and decode block 530 to communicate with the slave devices 508 and 510. It is further noted that connections 512 and 514 can be provided, for example, using copper pillars (CuP) and related micro-pads, as described herein.

As also indicated above, by re-configuring the decode block 526 using the DTDP expansion device configuration information, the DTDP expansion master/slave device appears to be resident on the host device as another internal operational sub-block for the DTDP host device. As such, the DTDP host device and DTDP expansion device operate as a homogeneous device by default. Further, by using CuP connections, communication delays between the DTDP host device and the DTDP expansion device are reduced. It is further noted that decode block 528 or other additional decode blocks could also be re-configured using the DTDP expansion device configuration information, if communication between other master blocks, such as the DMA master block 506, and the DTDP expansion master/slave device were desired. Other variations could also be implemented, if desired.

FIG. 8 is a block diagram of an embodiment 800 for a master/slave DTDP device. Connections 820 are provided as connections to the DTDP host device. Level shifting circuitry 802, which is described in more detail below, can also be provided, if desired. As with FIG. 6, embodiment 800 includes an interconnection fabric (ICF) 604, configuration block 606, delayed lock loop (DLL) circuitry 608, regulator 610, and test control circuitry 612. The ICF 604, such as an XBar, can also be connected to additional bus interconnect circuitry (BUS) 616. In addition, the DTDP expansion device functionality, such as a memory block 614, can also be connected to the ICF 604. In contrast with FIG. 6, a master block 850 connected to ICF 604 is included within embodiment 800. The master block 850 is connected to DTDP host device through a separate ICF 854 (e.g., a 1:1 XBar) and the level shifting circuitry 802, if desired. A pad 852 is also shown as connected to master block 850 and the level shifting circuitry 602. Its also again noted that different and/or additional blocks could also be included, as desired. Further, it is again noted that the port interconnect fabric (ICF) 205 can be any desired interconnect circuitry that provides communication between the various circuit and functional blocks to which it is coupled. For example, high speed serial interconnects and/other other types of interconnects could be utilized, if desired.

Figure 9:
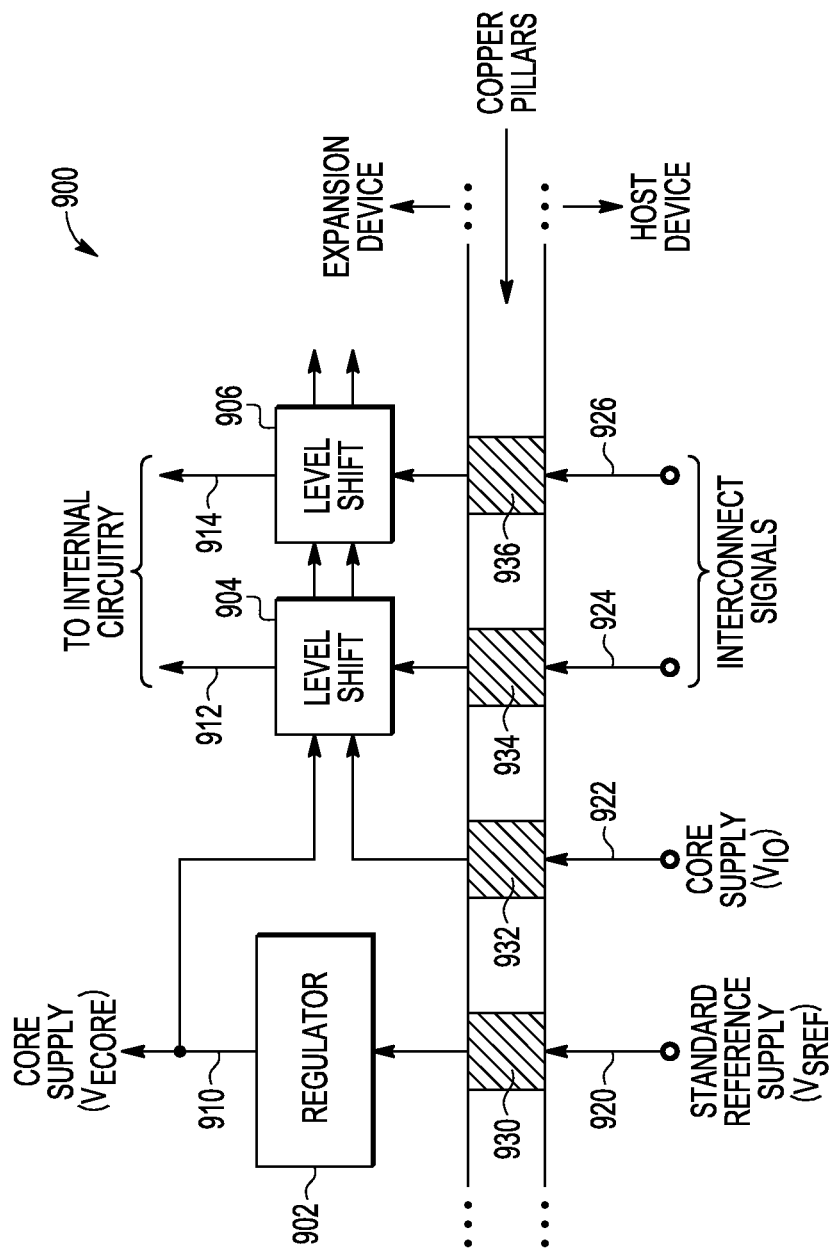
FIG. 9 is a block diagram of an embodiment for level shift circuitry included within an expansion device.
Figure 10:
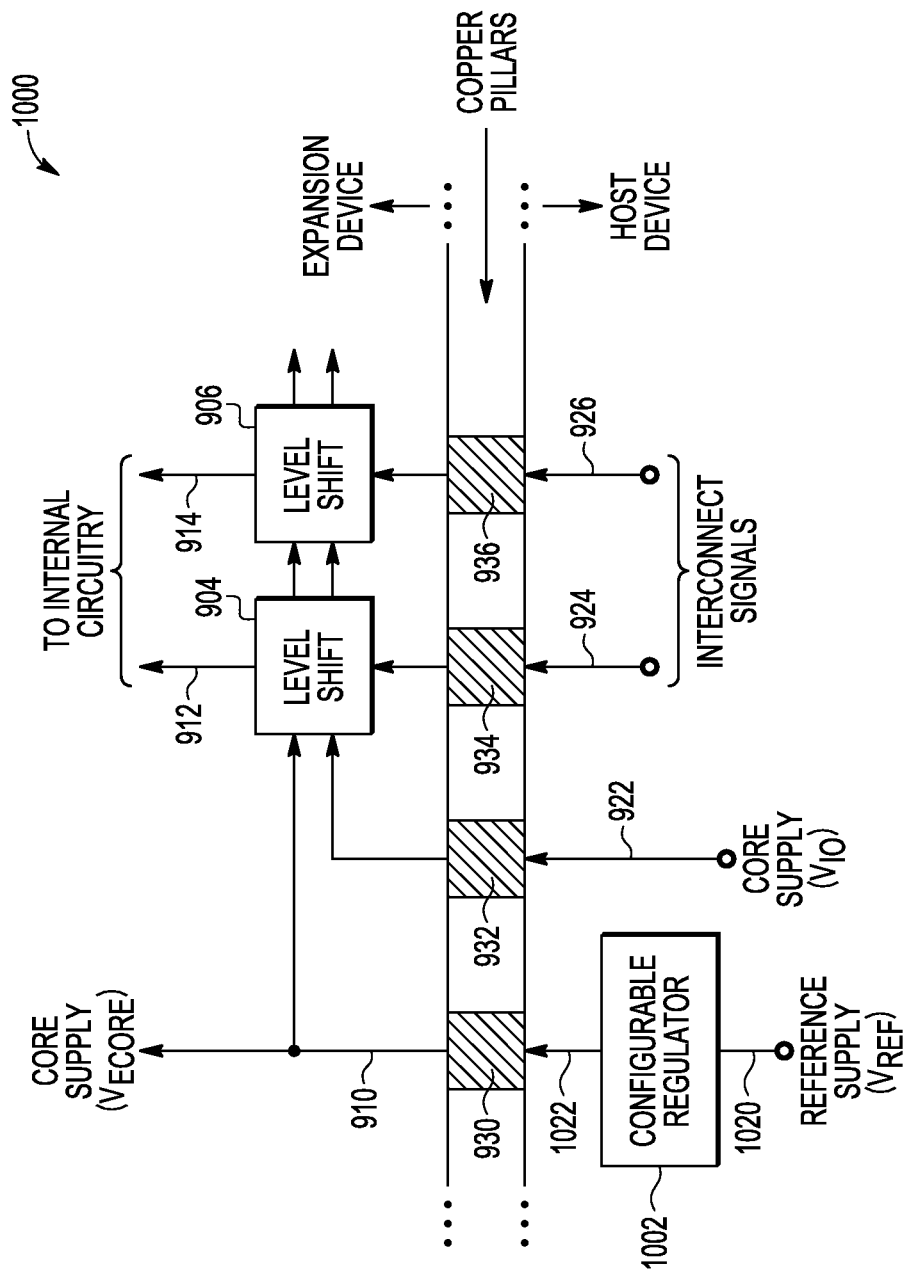
FIG. 10 is a block diagram of an embodiment for level shift circuitry included within an expansion device where a configurable regulator has been included on the host device.

FIGS. 9 and 10, which are described in further detail below, provide example embodiments that include level shift circuitry within the DTDP expansion device. As described above, level shift circuitry can be utilized within DTDP expansion devices to adjust signal levels received from DTDP host devices. By providing level shift circuitry, for example, the DTDP host devices can be configured to provide standard signal levels. The DTDP expansion devices can then utilize the level shift circuitry to adjust these signal levels as needed. Advantageously, level shift circuitry can be utilized, for example, to allow DTDP expansion devices built in a first processing technology to be attached to an internal bus fabric for a microcontroller or other DTDP host device built in a second processing technology. As one example, this level shift circuitry could be used to attach an expansion DTDP device that adds FLASH memory fabricated using an older processing technology with a microcontroller fabricated using a newer process technology which may not yet have an associated FLASH memory process. It is further noted that level shift circuitry could be included within the DTDP host device instead of or in addition to level shift circuitry with the DTDP expansion device.

For one example implementation, a microcontroller or other DTDP host device can be configured to provide one or more supply voltages to be used by the DTDP expansion device. In addition, the microcontroller or other DTDP host device can be configured to identify itself to the DTDP expansion device using any desired technique. For example, the microcontroller or DTDP host device can be configured to provide technology identification signals through the DTDP connections to the DTDP expansion device. The DTDP host device could also be configured to use voltage levels to identify itself. Other techniques could be utilized, as well. The DTDP expansion device can be configured to use the supply voltages from the DTDP host device for internal operations and can be configured to use the identity of the DTDP host device to configure level shift circuitry within the DTDP expansion device for signal interface connections. As a further implementation example, the microcontroller or other DTDP host device can be configured to provide a single supply voltage to the DTDP expansion device (e.g., 3.3 volt supply voltage, which is a common supply voltage for microcontroller external pins). The DTDP expansion device can then be configured to use the supply voltage and a regulator to generate one or more supply voltages to be used by the DTDP expansion device. For further embodiments, the DTDP expansion device can be configured to identify itself to the DTDP host device using any desired technique. The DTDP host device can then be configured to use identification information for the DTDP expansion device to configure supply voltage regulator circuitry and/or level shift circuitry within the DTDP host device for signal interface connections to the DTDP expansion device. Variations and further level shift configurations could also be implemented, as desired.

FIG. 9 is a block diagram of an embodiment 900 for level shift circuitry included within an expansion device. For the embodiment 900 depicted, the host device provides a standard reference supply voltage ($V_{SREF}$) 920, a core supply voltage ($V_{IO}$) 922, and interconnect signals 924 and 926 to an interface between the host device and the expansion device. As described herein, copper pillar (CuP) interconnects 930, 932, 934, and 936 can be utilized to provide the connection between the host device and the expansion device, if desired. As also described herein, other types of circuit connectors could also be utilized instead of CuP connectors, if desired. Once received through interconnect 930, the standard reference supply voltage ($V_{SREF}$) 920 is received by regulator 902. Regulator 902 then provides a core supply voltage ($V_{ECORE}$) 910, which can be used as a core supply voltage for the internal circuitry within the expansion device. The core supply voltage ($V_{ECORE}$) 910 can also be provided to level shift circuitry 904 and 906. Once received through interconnect 932, the core supply voltage ($V_{IO}$) 922 can be provided to level shift circuitry 904 and 906. Once received through interconnects 934 and 936, the interconnect signals 924 and 926 are provided to level shift circuitry 904 and 906. The level shift circuitry 904 and 906 then provide level shifted output signals 912 and 914 to internal circuitry for the expansion device. The level shifted output signals 912 and 914 are associated with the interconnect signals 924 and 926 and have been adjusted to match signal levels used by the internal circuitry for the expansion device.

It is noted that a variety of level shift implementations could be utilized while still providing interconnect signal adjustment within the expansion device. It is further noted that the level shift circuitry 904 and 906 can be implemented as one or more circuit blocks that adjust signal levels for signals received by the expansion device from the host device. Further, as described above, the expansion device can also utilize host device identification information to configure the regulator and level shift circuitry to adjust the signals received from the host device for use on the expansion device. Further, it is noted that the DTDP host device can be configured to include level shift circuitry to provide level shifted connection signals to the DTDP expansion device through the DTDP connections, if desired. This level shift circuitry within the DTDP host device can be used instead of level shift circuitry within the DTDP expansion device, if desired. Other variations could also be implemented.

FIG. 10 is a block diagram of an embodiment 1000 for level shift circuitry included within an expansion device where a configurable regulator 1002 has been included on the host device. Similar to FIG. 9, the host device provides a core supply voltage ($V_{IO}$) 922 and provides interconnect signals 924 and 926 to an interface between the host device and the expansion device. The interface can again be implemented using copper pillar (CuP) interconnects and/or other circuit interconnects, as desired. Once received through interconnect 932, the core supply voltage ($V_{IO}$) 922 can be provided to level shift circuitry 904 and 906. Once received through interconnects 934 and 936, the interconnect signals 924 and 926 are provided to level shift circuitry 904 and 906. The level shift circuitry 904 and 906 then provide level shifted output signals 912 and 914 to internal circuitry for the expansion device. The level shifted output signals 912 and 914 are associated with the interconnect signals 924 and 926 and have been adjusted to match signal levels used by the internal circuitry for the expansion device. It is further noted that the level shift circuitry 904 and 906 can be implemented as one or more circuit blocks that adjust signal levels for signals received by the expansion device from the host device. It is also again noted that level shift circuitry can be included on the DTDP host device instead of or in addition to the level shift circuitry on the DTDP expansion device, if desired.

In contrast with FIG. 9, embodiment 1000 includes a configurable regulator 1002 within the host device. The configurable regulator 1002 receives a reference supply voltage ($V_{REF}$) 1020 and outputs an adjusted reference supply voltage 1022 to interconnect 930. Once received through interconnect 930, the adjusted reference supply voltage is used as the expansion core supply voltage ($V_{ECORE}$) 910. The expansion core supply voltage ($V_{ECORE}$) 910, which can be used as a core supply voltage for the internal circuitry within the expansion device, can also be provided to level shift circuitry 904 and 906. Advantageously, therefore, the host device is able to provide the core supply voltage needed by the expansion device through the use of configurable regulator 1002. The host device uses expansion device information provided by the expansion device during start-up or reset to configure the configurable regulator to provide the desired voltage level for the expansion core supply voltage ($V_{ECORE}$) 910. It is further noted that configurable level shift circuitry could also be provided within the host device, if desired. This configurable level shift circuitry could also be configured to use expansion device information provided by the expansion device during start-up or reset to configure the configurable level shift circuitry to provide the desired signal levels prior to crossing the connection interface. While this configurable circuitry on the host device would increase the complexity of the host device, it would reduce the complexity of the expansion device.

As shown in FIGS. 9 and 10, therefore, the host device provides one or more power supply voltages to the expansion device. For example, the interface voltage ($V_{IO}$) 922 provides an operating voltage level for interface signals between the devices and would practically be the core supply voltage level of the host device. The expansion device then uses the interface voltage ($V_{IO}$) 922 to level shift one or more interconnect signals 924 and 926 using level shift circuitry 904 and 906. The standard reference voltage ($V_{SREF}$) 920 is configured to be a standard supply voltage level that all host devices provide to expansion devices, regardless of the type of host device or the type of expansion device. As shown with respect to FIG. 9, the expansion device uses a regulator 902 to adjust the standard reference voltage ($V_{SREF}$) 920 and to generate the expansion core supply voltage ($V_{ECORE}$) 910. Alternatively, as described with respect to FIG. 10, the host device can include a configurable regulator 1002 that is configured to directly provide the expansion core supply voltage ($V_{ECORE}$) 910 to the expansion device. It is noted that different and/or additional supply voltage levels could also be provided by the host device to the expansion device, as desired.

It is noted that the interface between DTDP expansion devices and DTDP host devices can be implemented as a standard set of DTDP device connections and configuration signals, if desired. In this way, additional or different DTDP expansion devices can be connected to DTDP host devices using a standard DTDP interface. TABLE 1 below provides an example for standard connections and configuration information that can be communicated between DTDP expansion devices and DTDP host devices, if desired. It is noted that different and/or additional signal connections and/or configuration information could be utilized, as desired, for a standard DTDP device interface.

TABLE 1

EXAMPLE STANDARD DTDP CONNECTION SIGNALS AND CONFIGURATION INFORMATION

| CONNECTION FUNCTION | DESCRIPTION |
| --- | --- |
| Expansion Identity | Identifies type of DTDP expansion device |
| Host Identity | Identifies type of DTDP host device |
| Reference Clock Phases | Reference clock phase information for clock duplication and optimal skew balancing |
| Reset and Low Power | Reset and low power mode signal(s) |
| Address Bases | Firmware programmable base addresses |
| Memory Map Sizes | Identifies number of memory blocks used |
| Interface Signals | Identifies standard interface signals and levels as provided by the DTDP host device, by DTDP slave device, and/or DTDP master/slave device |
| Supply voltages | DTDP host device core supply and high voltage supply (if needed) |
| JTAG | Standard JTAG interface for production test support |
| Test Interface | Additional characterization and test flows for DTDP expansion devices |
| Set-Asides | Signal set-asides allowed for future configuration options, such as for interrupts, DMA, input/output, interconnections |

As described herein, an internal bus interconnect fabric (ICF), such as an AHB XBar master port, can be utilized as expansion port connectivity for connecting the DTDP expansion device to the DTDP host device. It again noted that other port interconnect circuitry could also be utilized, if desired. To facilitate plug-and-play connectivity for the expansion device, the ICF uses configurable address mapping logic to allow for the plug-and-play insertion of expansion devices. During operation, default address configuration information is provided by the expansion device to the host device. Further, configuration information can be overridden by firmware or non-volatile memory as needed (e.g., firmware or non-volatile memory may change starting address) within the ICF. To pass information between the host device and the expansion device, a DTDP interconnect is utilized. Transferred information for plug-and-play functionality can include: expansion information for expansion device registration with the host device, clocking information for domain balancing, plug-and-play address configuration, plug-and-play technology configuration, pre-defined set-asides for I/O (input/output), interrupt, and DMA requests, and other desired information. The expansion device connections are configured to be low latency and to allow re-use. If desired, DLL (delay locked loop) circuitry can be used within the expansion device to adjust timing for clock balancing, and one clock stage can be added in each direction to ease timing integration between the expansion and host devices. Other variations could be implemented as desired.

To provide for plug-and-play functionality for the DTDP expansion devices, memory map configuration techniques are utilized to load expansion device information into the memory map for the host device. This memory map configuration allows for seamless plug-and-play operation for the DTDP expansion devices, which can be of a variety of different device types. Plug-and-play integrated address map circuitry, as described herein, operates to allow mixing and matching a variety of different expansion devices and a variety of different microcontrollers or other host devices within a variety of SiP configurations. Because the expansion devices may include any type of expansion functionality (e.g., memory, peripheral, etc), the plug-and-play address mapping allows for these different expansion devices to work seamlessly with a microcontroller or host device family in different SiP configurations. Further, this plug-and-play functionality allows for any give expansion device to be re-used on other host devices.

There are various implementations possible for a plug-and-play integrated address map circuitry. One method is for the expansion device to provide base address information and block size information through the DTDP connection with the host device. Bus fabric address decode logic is then included on the host device for plug-and-play address map integration of the expansion memory device map into the host device address map. Additionally, to allow for factory re-configuration of default plug-and-play address mapping, if needed, firmware or non-volatile memory configuration may override default base addresses provided by an expansion device. In this case, addresses are translated by the master host device and are provided to the expansion device. Another method is for the expansion device to provide block sizes through the DTDP connection with the host device, and the host device then provides to its address decode circuitry default base addresses for the expansion device. Further, using factory configuration, the default base addresses could be overridden by firmware or nonvolatile memory configuration, if desired, and then be provided to the expansion device. In this case, no address translation is needed by the host or expansion device for addresses provided to the expansion device. Other methods and implementations could also be used, as desired, to provide plug-and-play integrated address mapping for a variety of potentially different expansion devices.

Figure 11:
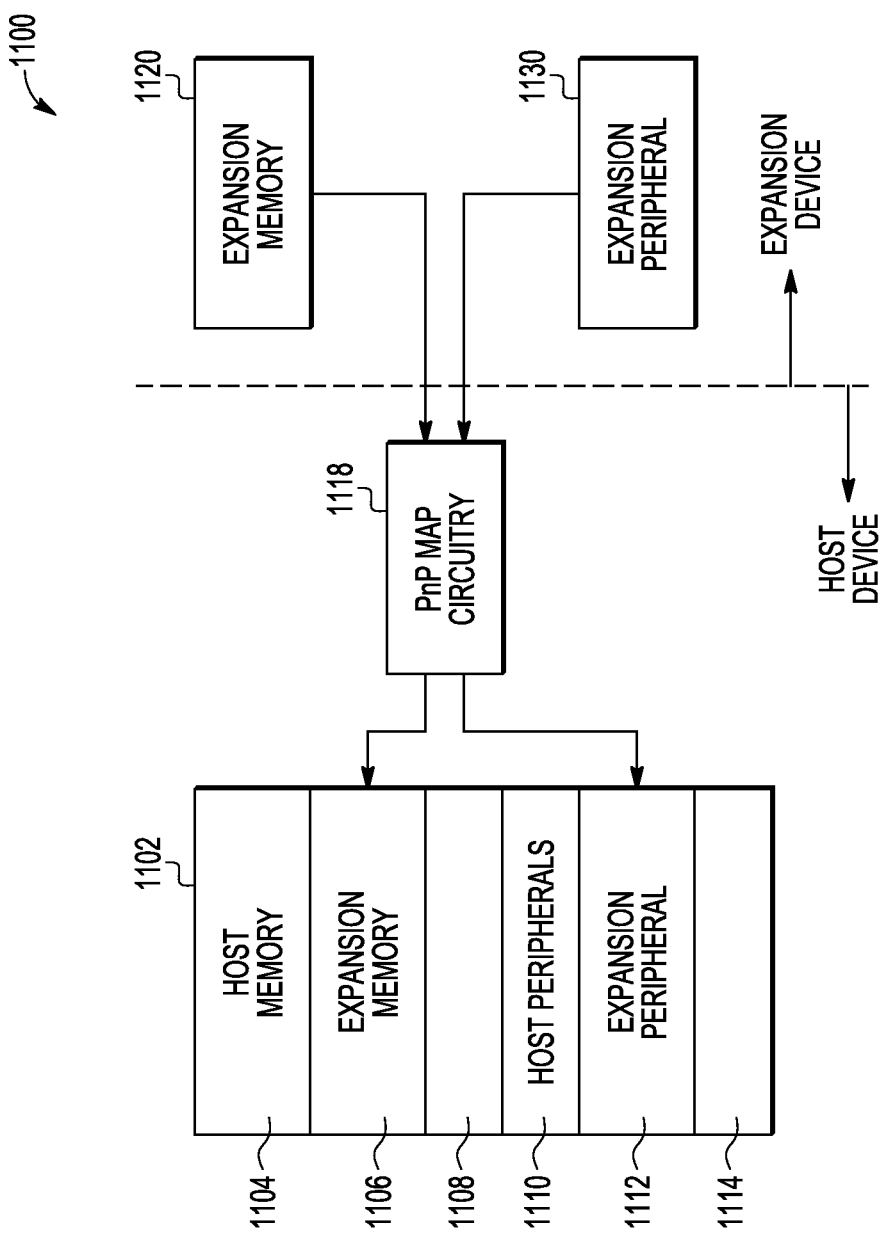
FIG. 11 is a block diagram of an embodiment for memory map of the expansion device into the host device memory.

FIG. 11 is a block diagram of an embodiment 1100 for memory map of the expansion device into the host device memory. As described herein, the expansion device can be a variety of different device types including expansion memory and an expansion peripheral(s). Block 1120 represents operation information for an expansion memory device. This expansion memory device information 1120 is then received by the plug-and-play (PnP) address map circuitry 1118 on the host device. The PnP map circuitry 1118 then integrates the expansion memory device information 1120 into the host device memory map 1102, for example, by loading it into slot 1106 within the host device memory map 1102 at start-up or reset. As depicted, the host device memory information is loaded into slot 1104, which is adjacent to slot 1106 that is used for the expansion memory device information in slot 1106. Block 1130 represents operation information for an expansion peripheral device. This expansion peripheral device information 1130 is also received by the PnP map circuitry 1118 on the host device. The PnP map circuitry 1118 then integrates the expansion peripheral device information into the host memory map 1102, for example, by loading it into slot 1112 within the host device memory map 1102 at start-up or reset. As depicted, the host device peripheral information is loaded into slot 1110, which is adjacent to slot 1112 used for the expansion peripheral device information. For the embodiment depicted, slots 1108 and 1114 are not used. By integrating the expansion device memory map information into the memory map 1102 for the host device, the expansion device will appear to be circuitry seamlessly operating within the host device during operation. It is noted that the PnP map circuitry 1118 be incorporated into the ICF 205 shown in FIGS. 5 and 7, if desired.

Advantageously, the PnP integrated address map circuitry 1118 enables mixing and matching a library of expansion devices and a family of host devices in various SiP configurations. Because the PnP map circuitry 1118 allows for seamless integration of memory map information, the expansion devices can be any type of device (e.g., memory, peripheral, etc). One technique for providing default plug-and-play address map integration using the PnP map circuitry 1118 includes having the expansion device provide default base addresses (e.g., system and peripheral bus) and block sizes (e.g., number of 16K bytes) to the main device through the DTDP interconnects. Further, the main device provides address decode circuitry, for example, using the ICFs described above. The main device will detect that an expansion device is connected and then will receive that base addresses and block sizes at start-up or reset. The main device will then re-configure its address map (e.g., during power-up reset state) to integrate the expansion device's address map into the address map for the host device. If desired, the host device can also include a programmable configuration option to override default base addresses, if desired, and to translate addresses provided to the expansion device based upon the re-configured base addresses. Another technique for providing default plug-and-play address map integration is to have the expansion device provide block sizes to the main device. The main device then provides base addresses to the expansion device. The main device is also configured to support factory configuration of default base addresses. The main device also provides programmable decode circuitry. The main device detects if expansion device is connected and receives block sizes during start-up or reset. The main device then configures its address map to integrate the expansion device's address map into its own. Other variations could also be implemented, as desired.

In contrast with prior plug-and-play solutions, which are designed to allow two independent devices to operate together, the plug-and-play SiP embodiments described herein establish plug-and-play operation between two devices which are intended to perform as one homogeneous device by default (e.g., out of reset or start-up). Additionally, the plug-and-play SiP embodiments described herein allow for hardware plug-and-play operation for a library of different expansion devices configured in a SiP with a variety of different host devices, without the need for software initialization or drivers.

As described herein, a variety of embodiments can be implemented and different features and variations can be implemented, as desired.

One disclosed embodiment is a die-to-die port (DTDP) system including a DTDP expansion device within a first integrated circuit and a DTDP host device within a second integrated circuit. The DTDP expansion device includes an expansion circuit block configured to provide expansion functionality for a DTDP host device and includes a circuit interconnection block coupled to the expansion circuit block and configured to provide interconnectivity to a DTDP host device. The DTDP host device includes port interconnect circuitry having a plurality of ports and being configured to provide communication between the plurality of ports with the port interconnect circuitry being further configured to cause the expansion functionality to appear to be resident on the DTDP host device, includes a master circuit block coupled to the port interconnect circuitry and configured to provide functionality for the DTDP host device, and includes a circuit interconnection block coupled to the port interconnect circuitry and being configured to provide interconnectivity to the DTDP expansion device using at least one of the plurality of ports.

In further embodiments, the first integrated circuit and the second integrated circuit can be packaged within a single package to form a system-in-package (SiP) device. In addition, the port interconnect circuitry can include crossbar interconnect fabric circuitry. In further embodiments, the DTDP expansion device can further include port interconnect circuitry having a plurality of ports with at least one port being coupled to the expansion circuit block, and the circuit interconnection block for the DTDP expansion device can be configured to provide interconnectivity to the DTDP host device using at least one of the plurality of ports. Still further, the circuit interconnection block for the DTDP host device and the circuit interconnection block for the DTDP expansion device can include copper pillar connectors. In still further embodiments, the DTDP expansion device can include a slave device, and one port on the port interconnect circuitry for the DTDP host device can be used to communicate with a port on the DTDP expansion device. In addition, the DTDP expansion device can include a master/slave device, and two ports on the port interconnect circuitry for the DTDP expansion device can be used to communicate with a master port and a slave port on the DTDP expansion device. Further, at least one of DTDP expansion device identity information, a DTDP host device identity information, clock information, or signal level information can be configured to be communicated between the DTDP expansion device and the DTDP host device during start-up or reset.

In other embodiments, DTDP host device can be further configured to provide at least one interconnect signal to the DTDP expansion device during operation through the circuit interconnection blocks for the DTDP expansion device and DTDP host device. Further, the DTDP expansion device can further include level shift circuitry configured to adjust a voltage level for the at least one interconnect signal for use within the DTDP expansion device. Still further, the DTDP host device can further include level shift circuitry configured to adjust a voltage level for the at least one interconnect signal for use within the DTDP expansion device.

In still further embodiments, the DTDP host device can be configured to provide at least one voltage supply signal to the DTDP expansion device during operation through the circuit interconnection blocks for the DTDP expansion device and DTDP host device. Further, the DTDP expansion device can further include regulator circuitry configured to adjust a voltage level for the at least one voltage supply signal for use within the DTDP expansion device. Still further, the DTDP host device can further include regulator circuitry configured to adjust the at least one voltage supply signal for use by the DTDP expansion device.

Another disclosed embodiment is a method for operating a die-to-die port (DTDP) system including providing expansion functionality for a DTDP host device using an expansion circuit block within a DTDP expansion device with the DTDP expansion device being within a first integrated circuit, utilizing a circuit interconnection block within the DTDP expansion device to provide interconnectivity to the DTDP host device, providing host functionality using a host DTDP device within a second integrated circuit, utilizing port interconnect circuitry within the DTDP host device to provide connectivity between a plurality of ports within the host DTDP device and to cause the expansion functionality to appear to be resident on the DTDP host device, communicating between a master circuit block and the port interconnect circuitry within the DTDP host device to provide functionality for the DTDP host device, and utilizing a circuit interconnection block within the DTDP host device to provide interconnectivity to the DTDP expansion device using at least one of the plurality of ports.

In further embodiments, the first integrated circuit and the second integrated circuit can be packaged within a single package to form a system-in-package (SiP) device. In addition, the DTDP expansion device can include a slave device, and the method can further include using one port for the port interconnect circuitry on the DTDP host device to communicate with a port on the DTDP expansion device. Still further, the DTDP expansion device can include a master/slave device, and the method can further include using two ports for the port interconnect circuitry on the DTDP host device to communicate with a master port and a slave port on the DTDP expansion device. Further, the method can include communicating at least one of DTDP expansion device identity information, DTDP host device identity information, clock information, or signal level information between the DTDP expansion device and the DTDP host device during start-up or reset.

In other embodiments, the method can further include using level shift circuitry to adjust a voltage level for the at least one interconnect signal communicated between the DTDP host device to the DTDP expansion device during operation. In still further embodiments, the method can further include providing at least one voltage supply signal from the DTDP host device to the DTDP expansion device during operation. In addition, the method can further include using regulator circuitry to adjust a voltage level for the at least one voltage supply signal.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. A die-to-die port (DTDP) system, comprising:
    a DTDP expansion device within a first integrated circuit; and
    a DTDP host device within a second integrated circuit;
    the DTDP expansion device within the first integrated circuit, comprising:
        an expansion circuit block configured to provide expansion functionality for the DTDP host device; and
        a circuit interconnection block coupled to the expansion circuit block and configured to provide interconnectivity to the DTDP host device; and
    the DTDP host device within the second integrated circuit, comprising:
        port interconnect circuitry having a plurality of ports and being configured to provide communication between the plurality of ports, the port interconnect circuitry being further configured to cause the expansion functionality to appear to be resident on the DTDP host device;
        a master circuit block coupled to the port interconnect circuitry and configured to provide functionality for the DTDP host device; and
        a circuit interconnection block coupled to the port interconnect circuitry and being configured to provide interconnectivity to the DTDP expansion device using at least one of the plurality of ports;
    wherein the DTDP host device is configured to provide at least one voltage supply signal to the DTDP expansion device during operation through the circuit interconnection blocks for the DTDP expansion device and DTDP host device.

2. The DTDP system of claim 1, wherein the first integrated circuit and the second integrated circuit are packaged within a single package to form a system-in-package (SiP) device.

3. The DTDP system of claim 1, wherein the port interconnect circuitry comprises crossbar interconnect fabric circuitry.

4. The DTDP system of claim 1, wherein the DTDP expansion device further comprises port interconnect circuitry having a plurality of ports with at least one port being coupled to the expansion circuit block, and wherein the circuit interconnection block for the DTDP expansion device is configured to provide interconnectivity to the DTDP host device using at least one of the plurality of ports.

5. The DTDP system of claim 1, wherein the circuit interconnection block for the DTDP host device and the circuit interconnection block for the DTDP expansion device comprise copper pillar connectors.

6. The DTDP system of claim 1, wherein the DTDP expansion device comprises a slave device, and wherein one port on the port interconnect circuitry for the DTDP host device is used to communicate with a port on the DTDP expansion device.

7. The DTDP system of claim 1, wherein the DTDP expansion device comprises a master/slave device, and wherein two ports on the port interconnect circuitry for the DTDP host device are used to communicate with a master port and a slave port on the DTDP expansion device.

8. The DTDP system of claim 1, wherein at least one of DTDP expansion device identity information, DTDP host device identity information, clock information, or signal level information is configured to be communicated between the DTDP expansion device and the DTDP host device during start-up or reset.

9. The DTDP system of claim 1, wherein the DTDP host device is further configured to provide at least one interconnect signal to the DTDP expansion device during operation through the circuit interconnection blocks for the DTDP expansion device and the DTDP host device.

10. The DTDP system of claim 1, wherein the DTDP expansion device further comprises regulator circuitry configured to adjust a voltage level for the at least one voltage supply signal for use within the DTDP expansion device.

11. The DTDP system of claim 1, wherein the DTDP host device further comprises regulator circuitry configured to adjust the at least one voltage supply signal for use by the DTDP expansion device.

12. A die-to-die port (DTDP) system, comprising:
a DTDP expansion device within a first integrated circuit; and
a DTDP host device within a second integrated circuit;
the DTDP expansion device within the first integrated circuit, comprising:
an expansion circuit block configured to provide expansion functionality for the DTDP host device; and
a circuit interconnection block coupled to the expansion circuit block and configured to provide interconnectivity to the DTDP host device; and
the DTDP host device within the second integrated circuit, comprising:
port interconnect circuitry having a plurality of ports and being configured to provide communication between the plurality of ports, the port interconnect circuitry being further configured to cause the expansion functionality to appear to be resident on the DTDP host device;
a master circuit block coupled to the port interconnect circuitry and configured to provide functionality for the DTDP host device; and
a circuit interconnection block coupled to the port interconnect circuitry and being configured to provide interconnectivity to the DTDP expansion device using at least one of the plurality of ports;
wherein the DTDP host device is further configured to provide at least one interconnect signal to the DTDP expansion device during operation through the circuit interconnection blocks for the DTDP expansion device and the DTDP host device; and
wherein the DTDP expansion device further comprises level shift circuitry configured to adjust a voltage level for the at least one interconnect signal for use within the DTDP expansion device.

13. A die-to-die port (DTDP) system, comprising:
a DTDP expansion device within a first integrated circuit; and
a DTDP host device within a second integrated circuit;
the DTDP expansion device within the first integrated circuit, comprising:
an expansion circuit block configured to provide expansion functionality the DTDP host device; and
a circuit interconnection block coupled to the expansion circuit block and configured to provide interconnectivity to the DTDP host device; and
the DTDP host device within the second integrated circuit, comprising:
port interconnect circuitry having a plurality of ports and being configured to provide communication between the plurality of ports, the port interconnect circuitry being further configured to cause the expansion functionality to appear to be resident on the DTDP host device;
a master circuit block coupled to the port interconnect circuitry and configured to provide functionality for the DTDP host device; and
a circuit interconnection block coupled to the port interconnect circuitry and being configured to provide interconnectivity to the DTDP expansion device using at least one of the plurality of ports;
wherein the DTDP host device is further configured to provide at least one interconnect signal to the DTDP expansion device during operation through the circuit interconnection blocks for the DTDP expansion device and DTDP host device; and
wherein the DTDP host device further comprises level shift circuitry configured to adjust a voltage level for the at least one interconnect signal for use within the DTDP expansion device.

14. A method for operating a die-to-die port (DTDP) system, comprising:
providing expansion functionality for a DTDP host device using an expansion circuit block within a DTDP expansion device, the DTDP expansion device being within a first integrated circuit, and the DTDP host device being within a second integrated circuit;
utilizing a circuit interconnection block within the DTDP expansion device to provide interconnectivity to the DTDP host device;
providing host functionality using the DTDP host device;
utilizing port interconnect circuitry within the DTDP host device to provide connectivity between a plurality of ports within the DTDP host device and to cause the expansion functionality to appear to be resident on the DTDP host device;
communicating between a master circuit block and the port interconnect circuitry within the DTDP host device to provide functionality for the DTDP host device; and
utilizing a circuit interconnection block within the DTDP host device to provide interconnectivity to the DTDP expansion device using at least one of the plurality of ports; and
further comprising providing at least one voltage supply signal from the DTDP host device to the DTDP expansion device during operation.

15. The method of claim 14, wherein the first integrated circuit and the second integrated circuit are packaged within a single package to form a system-in-package (SiP) device.

16. The method of claim 14, wherein the DTDP expansion device comprises a slave device, and further comprising using one port for the port interconnect circuitry on the DTDP host device to communicate with a port on the DTDP expansion device.

17. The method of claim 14, wherein the DTDP expansion device comprises a master/slave device, and further comprising using two ports for the port interconnect circuitry on the DTDP host device to communicate with a master port and a slave port on the DTDP expansion device.

18. The method of claim 14, further comprising communicating at least one of DTDP expansion device identity information, DTDP host device identity information, clock information, or signal level information between the DTDP expansion device and the DTDP host device during start-up or reset.

19. The DTDP system of claim 14, further comprising using regulator circuitry to adjust a voltage level for the at least one voltage supply signal.

20. A method for operating a die-to-die port (DTDP) system, comprising:
- providing expansion functionality for a DTDP host device using an expansion circuit block within a DTDP expansion device, the DTDP expansion device being within a first integrated circuit, and the DTDP hose device being within a second integrated circuit;
- utilizing a circuit interconnection block within the DTDP expansion device to provide interconnectivity to the DTDP host device;
- providing host functionality using the DTDP host device;
- utilizing port interconnect circuitry within the DTDP host device to provide connectivity between a plurality of ports within the DTDP host device and to cause the expansion functionality to appear to be resident on the DTDP host device;
- communicating between a master circuit block and the port interconnect circuitry within the DTDP host device to provide functionality for the DTDP host device; and
- utilizing a circuit interconnection block within the DTDP host device to provide interconnectivity to the DTDP expansion device using at least one of the plurality of ports; and
- further comprising using level shift circuitry to adjust a voltage level for at least one interconnect signal communicated between the DTDP host device to the DTDP expansion device during operation.

* * * * *